(12) United States Patent
Lin

(10) Patent No.: US 11,641,735 B1
(45) Date of Patent: May 2, 2023

(54) MEMORY STRUCTURE HAVING A HEXAGONAL SHAPED BIT LINE CONTACT DISPOSED ON A SOURCE/DRAIN REGION

(71) Applicant: NANYA TECHNOLOGY CORPORATION, New Taipei (TW)

(72) Inventor: Yu-Ying Lin, Tainan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 9 days.

(21) Appl. No.: 17/451,157

(22) Filed: Oct. 18, 2021

(51) Int. Cl.
*H01L 27/108* (2006.01)

(52) U.S. Cl.
CPC .. *H01L 27/10888* (2013.01); *H01L 27/10814* (2013.01); *H01L 27/10823* (2013.01); *H01L 27/10876* (2013.01)

(58) Field of Classification Search
CPC ......... H01L 27/10823; H01L 27/10876; H01L 27/10888
USPC .................................. 257/907, 908
See application file for complete search history.

(56) References Cited

U.S. PATENT DOCUMENTS

2023/0011948 A1\* 1/2023 Kudo ................ H01L 27/10823

FOREIGN PATENT DOCUMENTS

TW 202105682 A 2/2021

OTHER PUBLICATIONS

Scott. E. Thompson et al., "A logic nanotechnology featuring strained-silicon," IEEE Electron Devices, vol. 25, No. 4, pp. 191-193, Apr. 2004.

\* cited by examiner

*Primary Examiner* — Hoai V Pham
(74) *Attorney, Agent, or Firm* — CKC & Partners Co., LLC

(57) ABSTRACT

A method of manufacturing a memory structure is provided. The method includes forming a first gate structure, a second gate structure, and a plurality of source/drain regions in a substrate, in which the plurality of source/drain regions are disposed on opposite sides of the first gate structure and the second gate structures; performing a dry etching process to form a trench between the first gate structure and the second gate structure; performing a wet etching process to expand the trench, in which the expanded trench has a hexagonal shaped cross section profile; and forming a bit line contact in the expanded trench.

8 Claims, 10 Drawing Sheets

MEMORY STRUCTURE HAVING A HEXAGONAL SHAPED BIT LINE CONTACT DISPOSED ON A SOURCE/DRAIN REGION

BACKGROUND

Field of Invention

The present invention relates to a memory structure and a method of manufacturing the same. More particularly, the present invention relates to a memory structure having a polygonal cross section profile.

Description of Related Art

A dynamic random access memory (DRAM) cell structure typically includes a transistor device and a capacitor. The transistor and the capacitor form a series connection with each other. Using a word line and a bit line, a DRAM cell structure can be read and programmed.

To satisfy the demand for ever-greater amounts of memory storage, the dimensions of the DRAM memory cells have been continuously reduced, and as a result, the packing densities of the DRAMs have increased considerably. As the dimensions of the transistors and capacitors have become smaller, there is a continuous need to improve the structure and the manufacturing process of memory devices.

SUMMARY

In accordance with an aspect of the present disclosure, a method of manufacturing a memory structure is provided. The method includes forming a first gate structure, a second gate structure, and a plurality of source/drain regions in a substrate, in which the plurality of source/drain regions are disposed on opposite sides of the first gate structure and the second gate structures; performing a dry etching process to form a trench between the first gate structure and the second gate structure; performing a wet etching process to expand the trench, in which the expanded trench has a hexagonal shaped cross section profile; and forming a bit line contact in the expanded trench.

According to some embodiments of the present disclosure, the wet etching process is performed with a tetramethyl ammonium hydroxide (TMAH) based solution.

According to some embodiments of the present disclosure, the wet etching process laterally and vertically expands the trench.

According to some embodiments of the present disclosure, the expanded trench has two tips laterally protruded toward the first gate structure and the second gate structure respectively.

According to some embodiments of the present disclosure, the bit line contact has a first tilt sidewall and a second tilt sidewall, and an angle between the first tilt sidewall and the second tilt sidewall is about 104-114 degrees.

According to some embodiments of the present disclosure, the bit line contact has a top width and a bottom width, and the top width is greater than the bottom width.

According to some embodiments of the present disclosure, the bit line contact includes phosphorous, arsenic, or carbon doped polysilicon.

According to some embodiments of the present disclosure, the dry etching process is performed with a halogen-based gas.

According to some embodiments of the present disclosure, forming the bit line contact in the expanded trench includes forming a conductive material in the expanded trench; and etching back the conductive material.

According to some embodiments of the present disclosure, the method further includes performing an implantation process.

According to some embodiments of the present disclosure, the method further includes forming a bit line on the bit line contact.

According to some embodiments of the present disclosure, the method further includes forming a capacitor electrically connecting to one of the source/drain regions.

In accordance with another aspect of the present disclosure, a memory structure is provided. The memory structure includes a first gate structure, a second gate structure, and a first source/drain region disposed in a substrate, in which the first source/drain region is disposed between the first gate structure and the second gate structures. The memory substrate further includes a bit line contact disposed on the first source/drain region, in which the bit line contact has a hexagonal shaped cross section profile.

According to some embodiments of the present disclosure, the bit line contact has two tips laterally protruded toward the first gate structure and the second gate structure respectively.

According to some embodiments of the present disclosure, the bit line contact has a first tilt sidewall and a second tilt sidewall, and an angle between the first tilt sidewall and the second tilt sidewall is about 104-114 degrees.

According to some embodiments of the present disclosure, the bit line contact has a top width and a bottom width, and the top width is greater than the bottom width.

According to some embodiments of the present disclosure, the bit line contact includes phosphor, arsenic, or carbon doped polysilicon.

According to some embodiments of the present disclosure, the bit line contact has a convex top surface.

According to some embodiments of the present disclosure, the memory structure further includes a bit line disposed on the bit line contact.

According to some embodiments of the present disclosure, the memory structure further includes a plurality of second source/drain regions and a plurality of capacitors. The first source/drain region and the second source/drain region are disposed on opposite sides of the first gate structure and the second gate structure respectively. The capacitors are electrically connected to the second source/drain regions.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
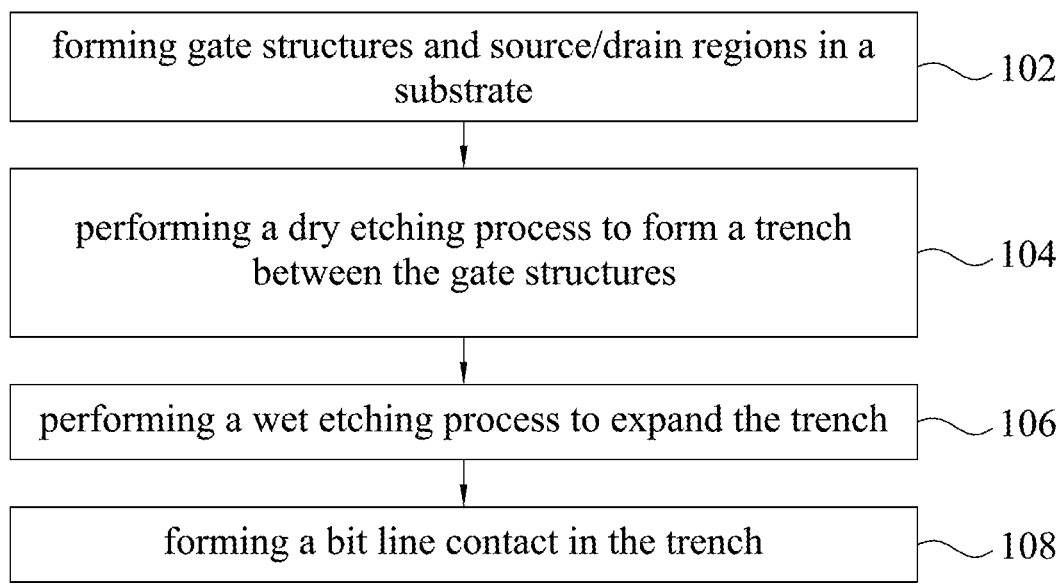
FIG. 1 is a flow chart illustrating a method of manufacturing a memory structure in accordance with some embodiments of this disclosure.

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Specific embodiments of the components and arrangements described below are intended to simplify the present disclosure. Of course, these are merely embodiments and are not intended to limit the present disclosure. For example, forming a first feature above or on a second feature in the subsequent description may include an embodiment in which the first feature and the second feature are formed as in direct contact, or include an embodiment in which an additional feature is formed between the first feature and the second feature such that the first feature and the second feature are not in direct contact. Additionally, component symbols and/or letters may be repeated in various embodiments of the present disclosure. This repetition is for the purpose of simplicity and clarity, and does not in itself indicate the relationship between the various embodiments and/or configurations discussed.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

FIG. 1 is a flow chart illustrating a method of manufacturing a memory structure in accordance with some embodiments of this disclosure. As shown in FIG. 1, the method 100 includes operation 102, operation 104, operation 106, and operation 108. The method for manufacturing the memory structure 10 will be further described according to one or more embodiments below. FIGS. 2-8 are cross-sectional views at various stages of method 100 according to some embodiments of the present disclosure.

Figure 2:
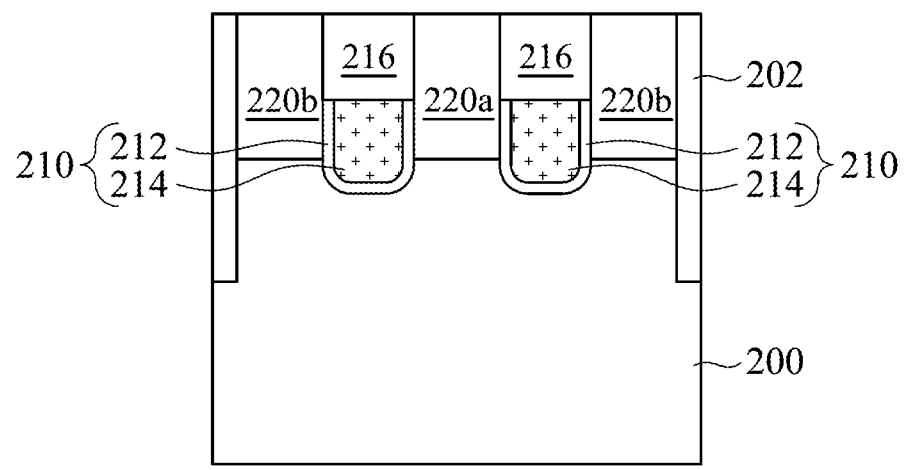
FIG. 2 to FIG. 4 are cross-sectional views of various intermediary stages in the manufacturing of memory structure in accordance with some embodiments of this disclosure.

Reference is made to FIG. 1 and FIG. 2. In the operation 102 of the method 100, gate structures 210 and source/drain (S/D) regions 220a, 220b are formed in a substrate 200. In some embodiments, the substrate 200 includes silicon (Si), silicon-germanium (SiGe), silicon carbide (SiC), gallium (Ga), gallium nitride (GaN), gallium arsenide (GaAs), epitaxy layer, combinations thereof, or the like.

Each of the gate structures 210 may include a gate electrode 214 and a gate dielectric layer 212 disposed between the gate electrode 214 and the substrate 200. An isolation structure 216 may be formed on each of the gate electrodes 214. In some embodiments, the gate structure 210 may be a buried gate structure. In some embodiments, the buried gate structure can serve as a buried word line (BWL) for a DRAM device. The source/drain regions 220a, 220b are disposed on opposite sides of the gate structures 210. In some embodiments, the source/drain regions 220a, 220b include an n-type doped region. As shown in FIG. 2, two gate structures 210 may share one S/D region 220a disposed between thereof. One gate structure 210 and source/drain region 220a and 220b constitute a transistor. A shallow trench isolation (STI) structure 202 is formed in the substrate 200 for defining at least one active region.

Figure 3:
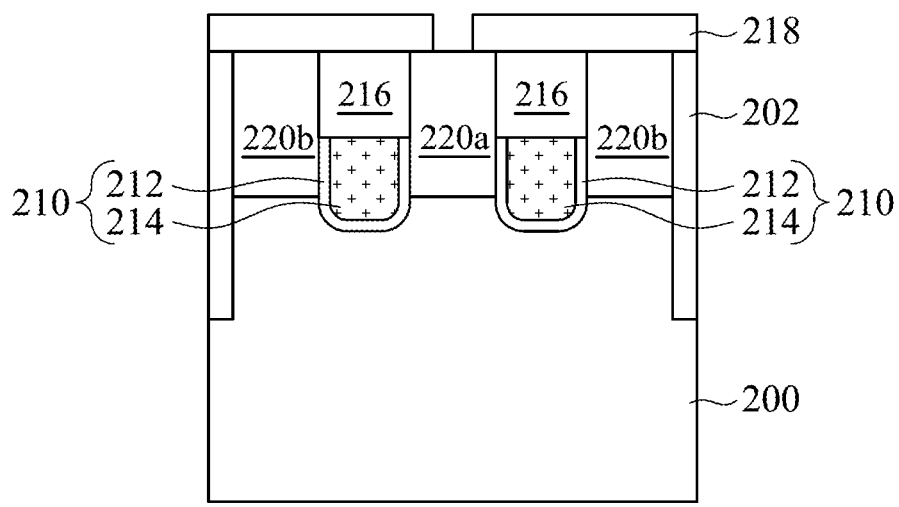
Figure 4:
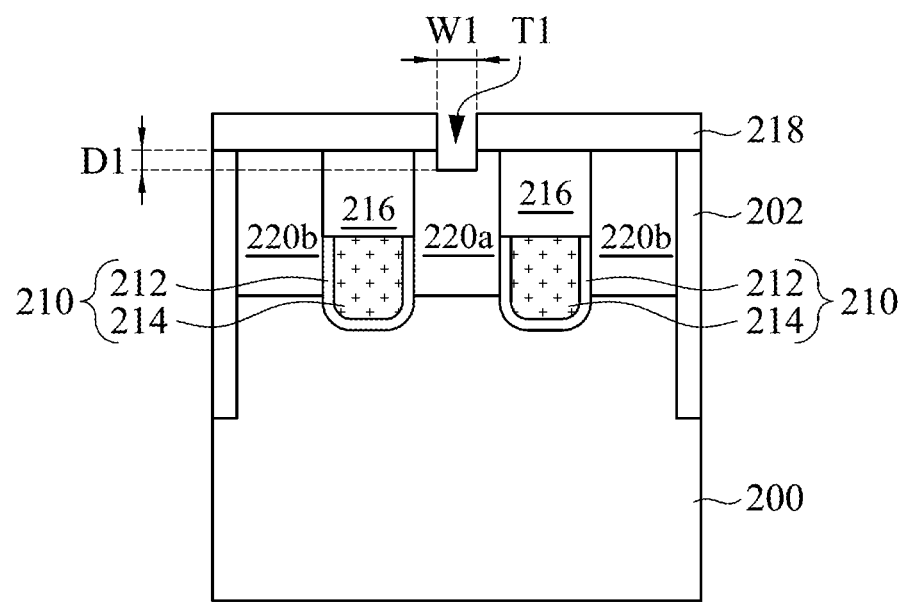

Referring to FIG. 1, in the operation 104 of the method 100, a dry etching process is performed to form a trench between the gate structures. FIG. 3 and FIG. 4 illustrate the detail steps of implementing operation 104 in accordance with some embodiments of the present disclosure.

Reference is made to FIG. 3. A patterned mask layer 218 is formed on the gate structures 210 and the S/D regions 220a, 220b. In some embodiments, the patterned mask layer 218 may be a single-layered structure or a multi layered structure. The patterned mask layer 218 exposes a portion of the substrate 200 (e.g. the S/D region 220a) between the gate structures 210.

Reference is made to FIG. 4. The exposed substrate 200 between the gate structures 210 is then removed by the dry etching process. In some embodiments, the dry etching process is performed with a halogen-based gas. For example, HBr, Cl-containing, F-containing gas, or the like may be used to etch the substrate 200. As such, the trench T1 is formed in the substrate 200 and between the gate structures 210. In some embodiments, the trench T1 has a width W1 of about 54-66 nm. In some embodiments, the trench T1 has a depth D1 of about 36-44 nm. For example, the width W1 and the depth D1 of the trench T1 may be about 60 nm and about 40 nm, respectively. As shown in FIG. 4, the trench T1 has a vertical sidewall. That is, the trench T1 may have substantially equal width W1 from its bottom to top. In some embodiments, a cleaning process can follow the dry etching process to remove residues of the etching substances and/or undesired substances formed during the dry etching process. For example, dilute HF may be used in the cleaning process.

Figure 5A:
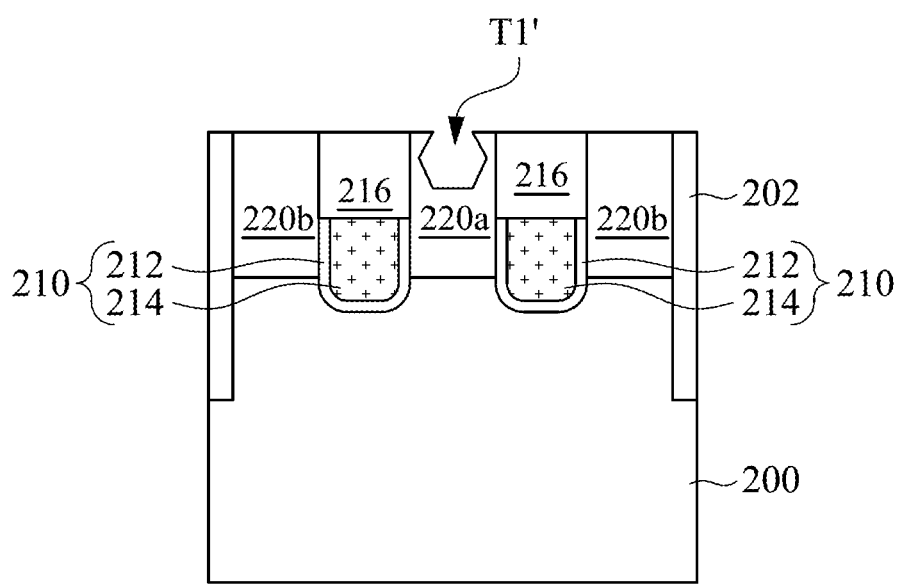
FIG. 5A is a cross-sectional view of various intermediary stages in the manufacturing of memory structure in accordance with some embodiments of this disclosure.
Figure 5B:
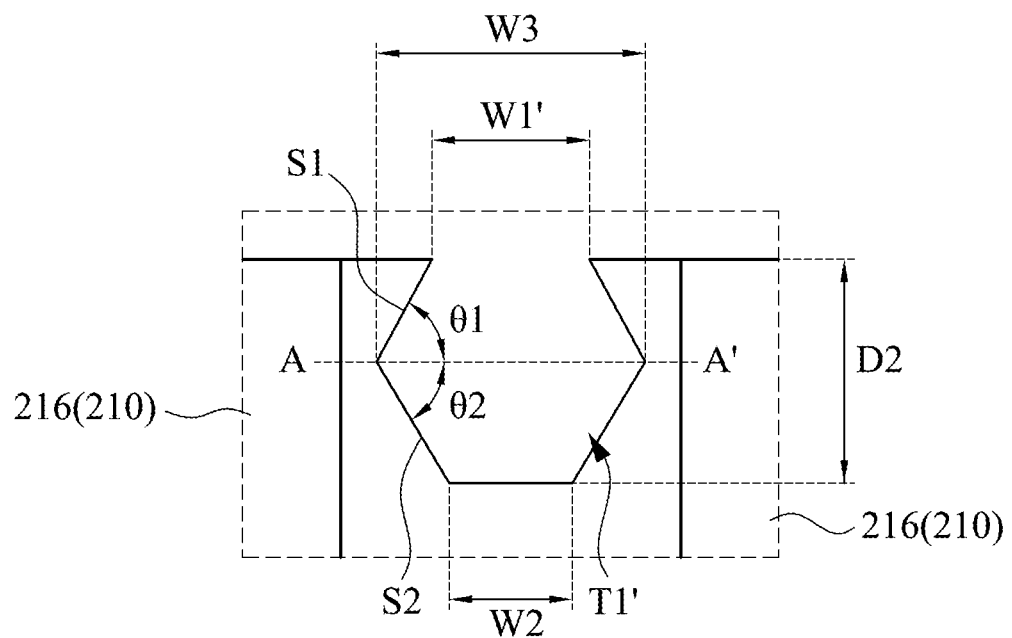
FIG. 5B is an enlarged diagram of an expanded trench in FIG. 5A.

Reference is made to FIG. 1 and FIGS. 5A-5B. In the operation 106 of the method 100, a wet etching process is performed to expand the trench T1 (shown in FIG. 4). After the dry etching process, the wet etching process laterally and vertically etches the substrate 200 to expand the trench T1. In some embodiments, the wet etching process is performed with a tetramethyl ammonium hydroxide (TMAH) based solution. In some examples, TMAH solution is used to etch the trench T1. A concentration of TMAH in the TMAH solution may be of about 2.35%, and a concentration of water may be 97.65%. The wet etching process may be performed at a temperature of about 25° C. for 170 seconds.

The structural detail of the expanded trench T1' is shown in FIG. 5B and described as follow. FIG. 5B is an enlarged diagram illustrating the expanded trench T1' in FIG. 5A. It is noted that some elements adjacent to the expanded trench T1' are not shown in FIG. 5B for clarity. In some embodiments, the expanded trench T1' has a polygonal shaped cross section profile. For example, the expanded trench T1' may have a hexagonal cross section profile. The expanded trench T1' has two tips laterally protruded toward the adjacent gate structures 210 respectively. The tips are constituted by a first tilt sidewall S1 and a second tilt sidewall S2. In some embodiments, an angle θ1 between the first tilt sidewall S1 and a reference line A-A' (the dashed line connecting the tips) is from about 52.7 to about 56.7 degrees, and an angle θ2 between the second tilt sidewall S2 and the reference line A-A' is from about 52.7 to about 56.7 degrees. In some embodiments, the angle θ1 is substantially equal to the angle θ2. For example, the angle θ1 and the angle θ2 may be 54.7 degrees, respectively. The angle θ1 and the angle θ2 may be related to the etching rate of the different crystal orientations.

In some embodiments, the expanded trench T1' has a top width W1' greater than a bottom width W2. In some embodiments, a middle width W3 is greater than the top width W1' and the bottom width W2. In some embodiments, the top width W1' is substantially equal to the width W1 of the trench T1 shown in FIG. 4, and the middle width W3 is greater than the width W1. In some embodiments, the top width W1' is of about 54-66 nm, the bottom width W2 is of about 28-36 nm, and the middle width W3 is of about 79-100 nm. In some embodiments, the expanded trench T1' has a depth D2 of about 54-66 nm. The expanded trench T1' has a lower portion (i.e., from a bottom surface of the expanded trench T1' to the reference line A-A') and an upper portion (i.e., from a top surface of the substrate 200 to the reference line A-A'). A depth of the lower portion is greater than that of the upper portion. In some examples, the top width W1' may be 60 nm, the bottom width W2 may be 32 nm, and the middle width W3 may be 88 nm. The upper portion of the expanded trench T1' may have a depth of about 20 nm, and the lower portion of the expanded trench T1' may have a depth of about 40 nm. The dimension of the expanded trench T1' is formed according to the demand of the subsequent formed bit line contact.

In some embodiments, a cleaning process can follow the wet etching process to remove residues of the etching substances and/or undesired substances formed during the dry etching process. For example, DI water may be used in the wet cleaning process.

In some embodiments, an implantation process may be further performed to the substrate 200. For example, phosphorous (P) ions, or the like are implanted into the substrate 200 exposed by the expanded trench T1' for decreasing the electrical resistance.

Figure 6A:
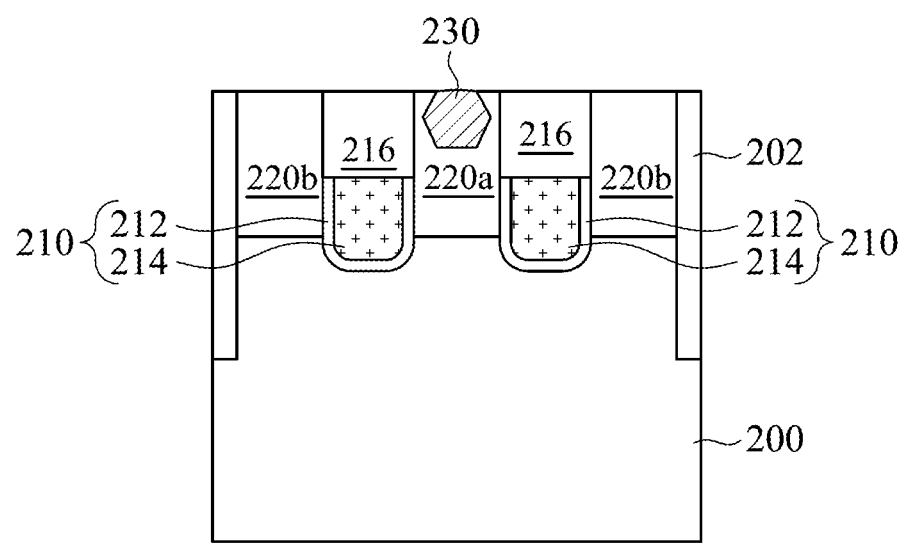
FIG. 6A is a cross-sectional view of various intermediary stages in the manufacturing of memory structure in accordance with some embodiments of this disclosure.
Figure 6B:
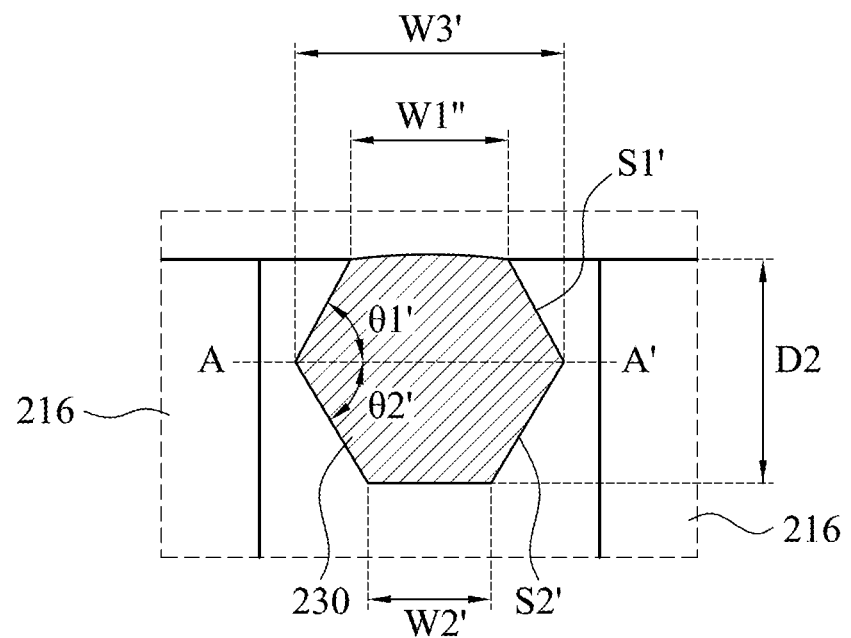
FIG. 6B is an enlarged diagram of a bit line contact in FIG. 6A.

Reference is made to FIG. 1 and FIGS. 6A-6B. In the operation 108 of the method 100, a bit line contact 230 is formed in the expanded trench T1'. In some embodiments, forming the bit line contact 230 in the trench T1 includes forming a conductive material (not shown) in the expanded trench T1' and then etching back the conductive material. In some embodiments, the bit line contact 230 includes phosphorous (P), arsenic (As), or carbon doped polysilicon. Specifically, the doped polysilicon can decrease the resistance of the bit line contact. Further, phosphorous has a smaller lattice constant than silicon, resulting in a tensile stress to increase the electron mobility of the NMOS.

The structural detail of the bit line contact 230 is shown in FIG. 6B and described as follow. FIG. 6B is an enlarged diagram illustrating the bit line contact 230 shown in FIG. 6A. It is noted that some elements adjacent to the bit line contact 230 is omitted for clarity. As shown in FIG. 6B, the bit line contact 230 may inherit the structure of the expanded trench T1' shown in FIG. 5B. That is, the bit line contact 230 has a polygonal shaped cross section profile. For example, the bit line contact 230 also has two tips laterally protruded toward the adjacent isolation structures 216. In some embodiments, the bit line contact 230 has a first tilt sidewall S1' and a second tilt sidewall S2', and an angle between the first tilt sidewall S1' and the second tilt sidewall S2' is about 104-114 degrees. Specifically, an angle θ1' between the first tilt sidewall S1' and a reference line A-A' (the dashed line connecting the tips) is from about 52.7 to about 56.7 degrees, and an angle θ2' between the second tilt sidewall S2' and the reference line A-A' is from about 52.7 to about 56.7 degrees. In some embodiments, the angle θ1' is substantially equal to the angle θ2'. In some examples, the angle θ1' and the angle θ2' may be 54.7 degrees, respectively.

In some embodiments, the bit line contact 230 has a top width W1" and a bottom width W2' greater than the top width W1", and a middle width W3' is greater than the top width W1" and the bottom width W2'. In some embodiments, the dimensions of the bit line contact may substantially equal to that of the expanded trench T1' shown in FIG. 5B. In some embodiments, the bit line contact 230 may have a substantially convex top surface. In other embodiments, the top surface of the bit line contact 230 may substantially level with the substrate 200 and the isolation structures 216.

Figure 7:
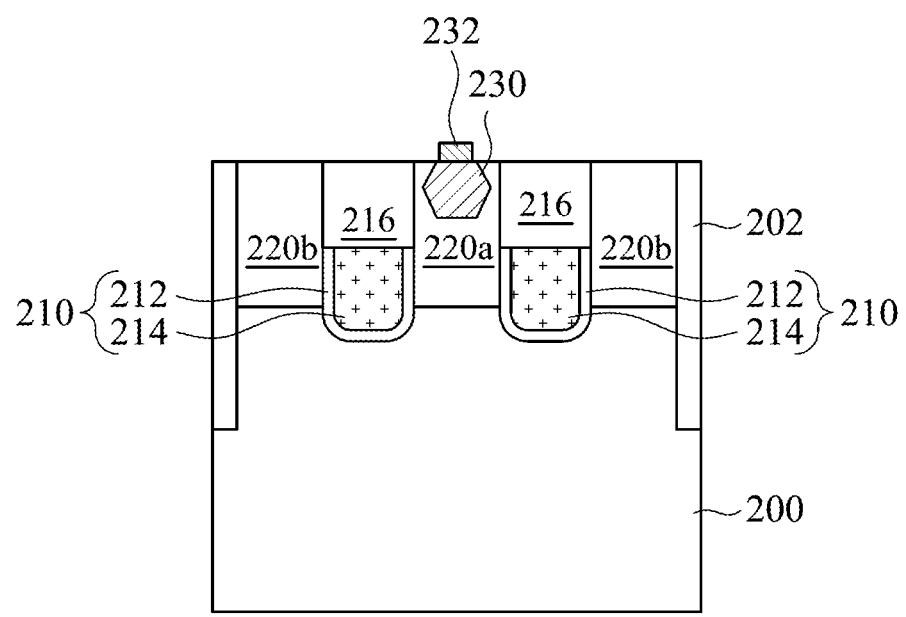
FIG. 7 to FIG. 8 are cross-sectional views of various intermediary stages in the manufacturing of memory structure in accordance with some embodiments of this disclosure.

Reference is made to FIG. 7. The method further includes forming a bit line 232 on the bit line contact 230. In some embodiments, the bit line 232 includes conductive material. In some embodiments, in the formation of the bit line 232, a portion of the bit line contact 230 (e.g., the convex top surface) may be removed. The bit line 232 is electrically connected to the source/drain region 220a through the bit line contact 230.

Figure 8:
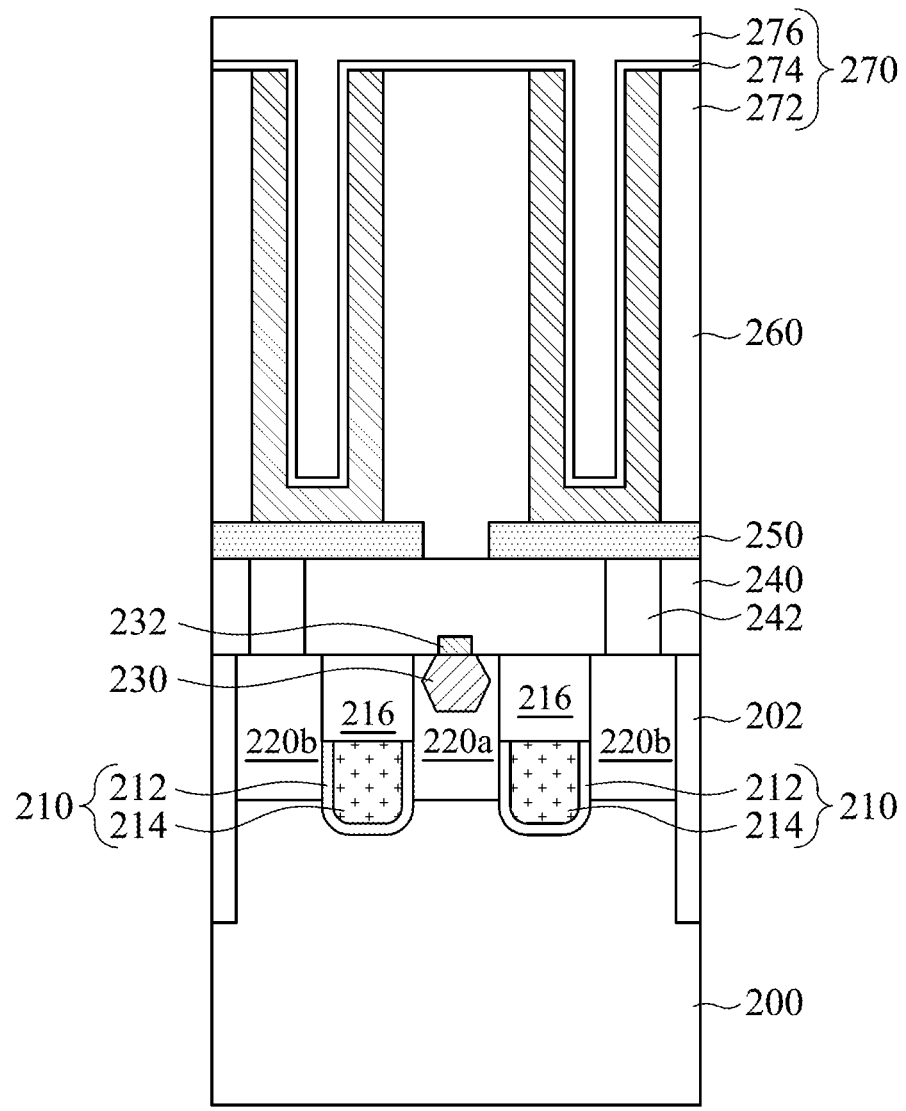

Reference is made to FIG. 8. The method further includes forming a plurality of capacitors 270 electrically connecting to the source/drain region 220b. Specifically, an interlayer dielectric (ILD) layer 240 is formed over the bit line 232. A plurality of contact plugs 242 are embedded in the ILD layer 240 and electrically connected to the source/drain regions 220b. A plurality of conductive pads 250 are further formed on the contact plugs 242. A dielectric layer 260 and the capacitors 270 are further formed on the conductive pads 250. In some embodiments, the capacitor 270 includes a bottom electrode 272, a top electrode 276, and an isolation layer 274 disposed between thereof. As such, the capacitor 270 is electrically connected to the source/drain regions 220b through the conductive pads 250 and the contact plugs 242.

Another aspect of the present disclosure is to provide a memory structure 10. As shown in FIG. 8, the memory structure 10 includes gate structures 210, source/drain regions 220a, 220b, and a bit line contact 230 embedded in the substrate 200. The source/drain regions 220a, 220b are disposed between the gate structures 210. The bit line contact 230 is disposed on the source/drain region 220a and has a polygonal shaped cross section profile. In some embodiments, the bit line contact 230 has two tips laterally protruded toward the adjacent gate structures 210 respectively. In some embodiments, the bit line contact 230 includes phosphorous, arsenic, or carbon doped polysilicon. A bit line 232 is further disposed on the bit line contact 230. Each of the capacitor 270s is electrically connected to one source/drain region 220b through corresponding contact plug 242 and conductive pad 250. In some embodiment, the memory structure 10 may be DRAM, but the present disclosure is not limited thereto.

As described above, according to the embodiments of the present disclosure, a memory structure and a method of manufacturing thereof are provided. In the memory structure of the present disclosure, the bit line contact has a polygonal cross section profile. The bit line contact is formed by a dry etching process, followed by a wet etching and a deposition process. In specific, the wet etching process results in the polygonal shaped bit line contact. This profile increases the volume of the bit line contact and decrease electrical resistance. Further, the bit line contact includes doped polysilicon, such as phosphorous doped polysilicon, which can boost electron mobility of a NMOS. Therefore, the performance of the memory structure is enhanced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory structure, comprising:
   a first gate structure, a second gate structure, and a first source/drain region disposed in a substrate, wherein the first source/drain region is disposed between the first gate structure and the second gate structures; and
   a bit line contact disposed on the first source/drain region, wherein the bit line contact has a hexagonal shaped cross section profile.

2. The memory structure of claim 1, wherein the bit line contact has two tips laterally protruded toward the first gate structure and the second gate structure respectively.

3. The memory structure of claim 1, wherein the bit line contact has a first tilt sidewall and a second tilt sidewall, and an angle between the first tilt sidewall and the second tilt sidewall is about 104-114 degrees.

4. The memory structure of claim 1, wherein the bit line contact has a top width and a bottom width, and the top width is greater than the bottom width.

5. The memory structure of claim 1, wherein the bit line contact comprises phosphor, arsenic, or carbon doped polysilicon.

6. The memory structure of claim 1, wherein the bit line contact has a convex top surface.

7. The memory structure of claim 1, further comprising a bit line disposed on the bit line contact.

8. The memory structure of claim 1, further comprising:
   a plurality of second source/drain regions, wherein the first source/drain region and the second source/drain regions are disposed on opposite sides of the first gate structure and the second gate structure respectively; and
   a plurality of capacitors electrically connected to the second source/drain regions.

* * * * *